United States Patent
Ajima et al.

(10) Patent No.: US 10,374,142 B2
(45) Date of Patent: Aug. 6, 2019

(54) SURFACE ACOUSTIC WAVE DEVICE AND MANUFACTURING METHOD THEREFOR

(71) Applicant: Murata Manufacturing Co., Ltd., Nagaokakyo-shi, Kyoto-fu (JP)

(72) Inventors: Daisuke Ajima, Nagaokakyo (JP); Seiji Kai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 703 days.

(21) Appl. No.: 15/041,120

(22) Filed: Feb. 11, 2016

(65) Prior Publication Data

US 2016/0163957 A1 Jun. 9, 2016

Related U.S. Application Data

(63) Continuation of application No. PCT/JP2014/067228, filed on Jun. 27, 2014.

(30) Foreign Application Priority Data

Aug. 20, 2013 (JP) .................................. 2013-170116

(51) Int. Cl.
*H01L 41/107* (2006.01)
*H01L 23/10* (2006.01)
(Continued)

(52) U.S. Cl.
CPC ............ *H01L 41/107* (2013.01); *H01L 23/10* (2013.01); *H01L 41/29* (2013.01); *H03H 3/08* (2013.01);
(Continued)

(58) Field of Classification Search
CPC ......... H03H 3/08; H03H 9/059; H01L 41/107
(Continued)

(56) References Cited

U.S. PATENT DOCUMENTS 6,417,574 B1 * 7/2002 Misawa ................. H03H 9/059
257/737
7,427,824 B2 * 9/2008 Iwamoto .............. H03H 9/0576
310/313 R
(Continued)

FOREIGN PATENT DOCUMENTS

JP 2008-135999 A 6/2008
JP 2011-172190 A 9/2011
(Continued)

OTHER PUBLICATIONS

Official Communication issued in International Application PCT/JP2014/067228, dated Aug. 19, 2014.

*Primary Examiner* — J. San Martin
(74) *Attorney, Agent, or Firm* — Keating & Bennett, LLP

(57) ABSTRACT

In a surface acoustic wave device, a conductor pattern is located on a main surface of a piezoelectric substrate and includes a surface acoustic wave element pattern, a pad and a feed line that is electrically connected to the pad and extends up to an outer peripheral edge of the main surface. The piezoelectric substrate and a cover are bonded to each other with a support layer therebetween that includes a frame extending along the outer peripheral edge of the main surface so that a gap is provided between the frame and the outer peripheral edge and includes a pad adjacent portion on the pad. Thus, a closed space is surrounded by the piezoelectric substrate, the cover and the frame. The support layer further includes a reinforcement portion that intersects a feed line at or near an intersection portion in which a separated portion of the frame that is separated from the pad adjacent portion intersects the feed line.

10 Claims, 9 Drawing Sheets

(51) Int. Cl.
*H03H 3/08* (2006.01)
*H03H 9/05* (2006.01)
*H01L 41/29* (2013.01)

(52) U.S. Cl.
CPC .......... *H03H 9/059* (2013.01); *H01L 2224/11* (2013.01); *H01L 2924/0002* (2013.01)

(58) Field of Classification Search
USPC ........................................................ 310/313
See application file for complete search history.

(56) References Cited

U.S. PATENT DOCUMENTS

| | | | | |
|---|---|---|---|---|
| 9,197,192 | B2* | 11/2015 | Yamato | H03H 9/059 |
| 2005/0146397 | A1* | 7/2005 | Koga | H03H 9/0576 |
| | | | | 333/133 |
| 2006/0096945 | A1* | 5/2006 | Shen | C23F 1/02 |
| | | | | 216/2 |
| 2007/0046142 | A1* | 3/2007 | Obara | H03H 3/08 |
| | | | | 310/313 R |
| 2008/0122318 | A1 | 5/2008 | Aikawa et al. | |
| 2010/0038992 | A1* | 2/2010 | Moriya | H03H 9/02574 |
| | | | | 310/313 B |
| 2010/0253182 | A1 | 10/2010 | Takada et al. | |
| 2010/0327694 | A1* | 12/2010 | Omote | H03H 9/059 |
| | | | | 310/313 R |
| 2011/0176264 | A1* | 7/2011 | Tsuda | H03H 9/059 |
| | | | | 361/679.01 |
| 2012/0032759 | A1* | 2/2012 | Nishii | H03H 3/08 |
| | | | | 333/193 |
| 2013/0076205 | A1 | 3/2013 | Kurihara | |
| 2014/0368084 | A1* | 12/2014 | Fukano | H03H 9/02897 |
| | | | | 310/313 B |
| 2016/0036414 | A1* | 2/2016 | Hamaoka | H03H 9/1064 |
| | | | | 333/133 |
| 2017/0033763 | A1* | 2/2017 | Hira | H03H 3/08 |
| 2017/0093366 | A1* | 3/2017 | Kikuchi | H03H 3/08 |
| 2017/0317659 | A1* | 11/2017 | Takeshita | H03H 3/08 |

FOREIGN PATENT DOCUMENTS

| | | |
|---|---|---|
| JP | 2013-70347 A | 4/2013 |
| WO | 2009/078137 A1 | 6/2009 |
| WO | WO-2016147724 A1 * 9/2016 | ............... H03H 9/25 |

* cited by examiner

SURFACE ACOUSTIC WAVE DEVICE AND MANUFACTURING METHOD THEREFOR

BACKGROUND OF THE INVENTION

1. Field of the Invention

The present invention relates to a surface acoustic wave device and to a manufacturing method for the surface acoustic wave device, and more specifically relates to a surface acoustic wave device including a closed space and to a manufacturing method for the surface acoustic wave device.

2. Description of the Related Art

To date, a variety of surface acoustic wave devices having a closed space have been provided.

For example, in a surface acoustic wave device 101 illustrated as a sectional view in FIG. 15, a piezoelectric substrate 103 and a cover 137 are bonded to each other with a frame-shaped support layer 135 interposed therebetween and a closed space 110A is formed between the piezoelectric substrate 103 and the cover 137. A conductor pattern 111A that includes IDT electrodes and reflectors of surface acoustic wave elements and pads and wiring lines is formed on a main surface of the piezoelectric substrate 103 that faces the cover 137. A through conductor 107A that penetrates through the support layer 135 and the cover 137 and is electrically connected to a pad 113A is formed of a base layer 139 that is deposited on a bottom surface and an inner peripheral surface of a hole 105h through the support layer 135 and the cover 137 and around the hole 105h on the upper surface of the cover 137, and a solid portion 141 that fills the inside of the base layer 139 (for example, refer to Japanese Unexamined Patent Application Publication No. 2011-172190).

Surface acoustic wave devices can be efficiently manufactured by processing a plurality of such devices all together on a wafer piezoelectric substrate (aggregate substrate) and then dividing the substrate into individual substrates. When through conductors are to be formed by performing electroplating in the aggregate substrate state, a feed line is formed in advance on the aggregate substrate so that a current may flow to the pads in the plating step. The feed line is cut when the aggregate substrate is divided into individual substrates. Consequently, the feed line extends to an outer peripheral edge of a main surface of the piezoelectric substrate in each device divided from the aggregate substrate.

When the aggregate substrate is cut and divided into individual substrates by dicing, the feed line may peel off from the main surface of the piezoelectric substrate during dicing, adhesion between the support layer and the piezoelectric substrate, which form the closed space, may be reduced and a sealing property of the closed space may be reduced.

SUMMARY OF THE INVENTION

In view of this situation, preferred embodiments of the present invention provide a surface acoustic wave device that is capable of significantly reducing or preventing peeling off of a feed line from a piezoelectric substrate during dicing and that is capable of suppressing a reduction in a sealing property of a closed space, and provide a manufacturing method for the surface acoustic wave device.

A surface acoustic wave device according to a preferred embodiment of the present invention includes a piezoelectric substrate including a main surface, a conductor pattern located on the main surface and including a surface acoustic wave element pattern, a pad and a feed line that is electrically connected to the pad and extends up to an outer peripheral edge of the main surface, a support layer including a frame that is located on the main surface in a frame-shaped structure to extend along the outer peripheral edge of the main surface and so that a gap is provided between the frame and the outer peripheral edge, and a pad adjacent portion that is located on the pad, (d) a cover that is bonded to the support layer and faces the main surface, and (e) a through conductor that is electrically connected to the pad and is located inside a through hole that penetrates through an inside of the pad adjacent portion of the support layer in a direction in which the main surface is viewed in plan, a closed space being provided that is surrounded by the piezoelectric substrate, the cover and the support layer. The feed line includes a separated feed line that intersects a separated portion of the frame that is separated from the pad adjacent portion. The support layer further includes a reinforcement portion that is located on the main surface and intersects the separated feed line close to the separated portion.

In this configuration, when the reinforcement portion of the support layer is located on an outer side of the frame of the support layer, peeling off of the separated feed line is able to be stopped in front of the separated portion of the frame by the reinforcement portion even if the separated feed line peels off from the main surface of the piezoelectric substrate during dicing. In the case where the reinforcement portion of the support layer is integrated with the frame on an inner side of the frame of the support layer, the airtightness of the closed space is able to be maintained by the reinforcement portion even if the separated feed line peels off from the main surface of the piezoelectric substrate during dicing and the adhesion between the separated portion of the frame of the support layer and the separated feed line is reduced in the intersection portion.

With the above-described configuration, reduction of the sealing property of the closed space is significantly reduced or prevented by the reinforcement portion of the support layer.

In a preferable aspect of various preferred embodiments of the present invention, the reinforcement portion is located on an outer side of the frame. A width of the reinforcement portion, which is a dimension in a direction in which the reinforcement portion intersects the separated feed line, progressively becomes larger toward the frame.

In this case, stress acting during dicing in a direction in which the feed line extends is released by the reinforcement portion in a different direction to that in which the feed line extends and the airtightness of the closed space is maintained with more certainty.

In another preferable aspect of various preferred embodiments of the present invention, the reinforcement portion is provided on an outer side of the frame. A width of the reinforcement portion, which is a dimension in a direction in which the reinforcement portion intersects the separated feed line, becomes larger in a stepwise manner toward the frame.

In this case, stress acting in a direction of the feed line during dicing is released by the reinforcement portion in a different direction to that in which the feed line extends and the airtightness of the closed space is maintained with more certainty.

In another preferable aspect of various preferred embodiments of the present invention, the reinforcement portion is provided outside of the frame and is separated from the frame.

In this case, peeling off of the separated feed line is able to be stopped in front of the frame by the reinforcement portion and reduction of the sealing property of the closed space is suppressed or prevented.

In addition, another preferred embodiment of the present invention provides a manufacturing method for a surface acoustic wave device including first to fourth steps. In the first step, a conductor pattern is formed on a main surface of a piezoelectric substrate, the conductor pattern including a surface acoustic wave element pattern, a pad and a feed line that is electrically connected to the pad and extends up to an outer peripheral edge of the main surface. In the second step, a support layer is formed on the main surface of the piezoelectric substrate on which the conductor pattern has been formed, the support layer including a frame that is formed in a frame-shaped structure to extend along the outer peripheral edge of the main surface of the piezoelectric substrate and so that a gap is provided between the frame and the outer peripheral edge, and a pad adjacent portion that is formed on the pad. In the third step, a cover that faces the main surface of the piezoelectric substrate is bonded to the support layer to form a closed space that is surrounded by the piezoelectric substrate, the cover and the support layer. In the fourth step, a through conductor is formed that is electrically connected to the pad and is formed inside a through hole that penetrates through the pad adjacent portion of the support layer in a direction in which the main surface is viewed in plan. The feed line formed in the first step includes a separated feed line that intersects a separated portion of the frame that is separated from the pad adjacent portion formed in the second step. The support layer formed in the second step further includes a reinforcement portion that is formed on the main surface and intersects the separated feed line close to the separated portion.

With the above-described method, reduction of the sealing property of the closed space is suppressed or prevented by the reinforcement portion of the support layer.

In a preferable aspect of various preferred embodiments of the present invention, in the second step, the reinforcement portion is formed on an outer side of the frame so that a width of the reinforcement portion, which is a dimension in a direction in which the reinforcement portion intersects the separated feed line, progressively becomes larger toward the frame.

In this case, stress acting during dicing processing in a direction in which the feed line extends is released by the reinforcement portion in a different direction to that in which the feed line extends and the airtightness of the closed space is able to be maintained with more certainty.

In another preferable aspect of various preferred embodiments of the present invention, in the second step, the reinforcement portion is formed on an outer side of the frame so that a width of the reinforcement portion, which is a dimension in a direction in which the reinforcement portion intersects the separated feed line, becomes larger in a stepwise manner toward the frame.

In this case, stress acting during dicing processing in a direction in which the feed line extends is released by the reinforcement portion in a different direction to that in which the feed line extends and the airtightness of the closed space is able to be maintained with more certainty.

In another preferable aspect of various preferred embodiments of the present invention, the fourth step includes a step of forming a through hole in the cover before the third step such that the through hole is superposed with the through hole in the pad adjacent portion when the main surface is viewed in plan when the support layer and the cover are bonded to each other.

In another preferable aspect of various preferred embodiments of the present invention, the fourth step includes a step of forming a through hole in the cover after the third step such that the through hole is superposed with the through hole in the pad adjacent portion when the main surface is viewed in plan when the support layer and the cover are bonded to each other.

According to various preferred embodiments of the present invention, reduction of a sealing property of a closed space of a surface acoustic wave device is suppressed or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described while referring to FIGS. 1 to 14.

Preferred Embodiment 1

A surface acoustic wave device 10 according to Preferred Embodiment 1 of the present invention will be described while referring to FIGS. 1 to 8.

Figure 1:
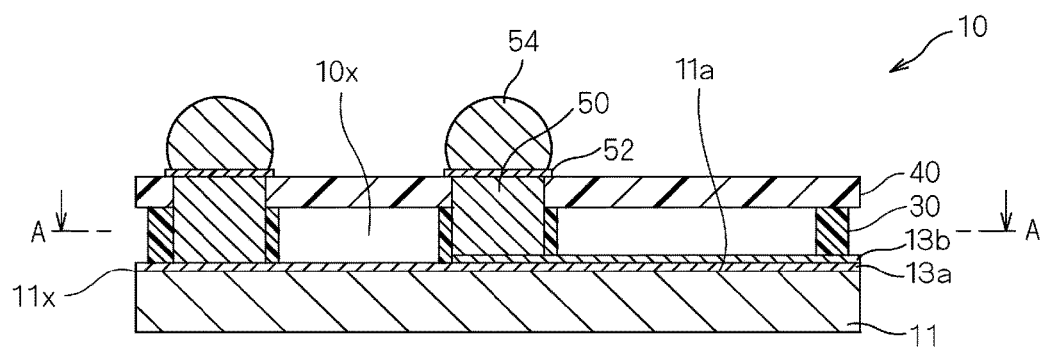
FIG. 1 is a sectional view of a surface acoustic wave device according to Preferred Embodiment 1 of the present invention.
Figure 2:
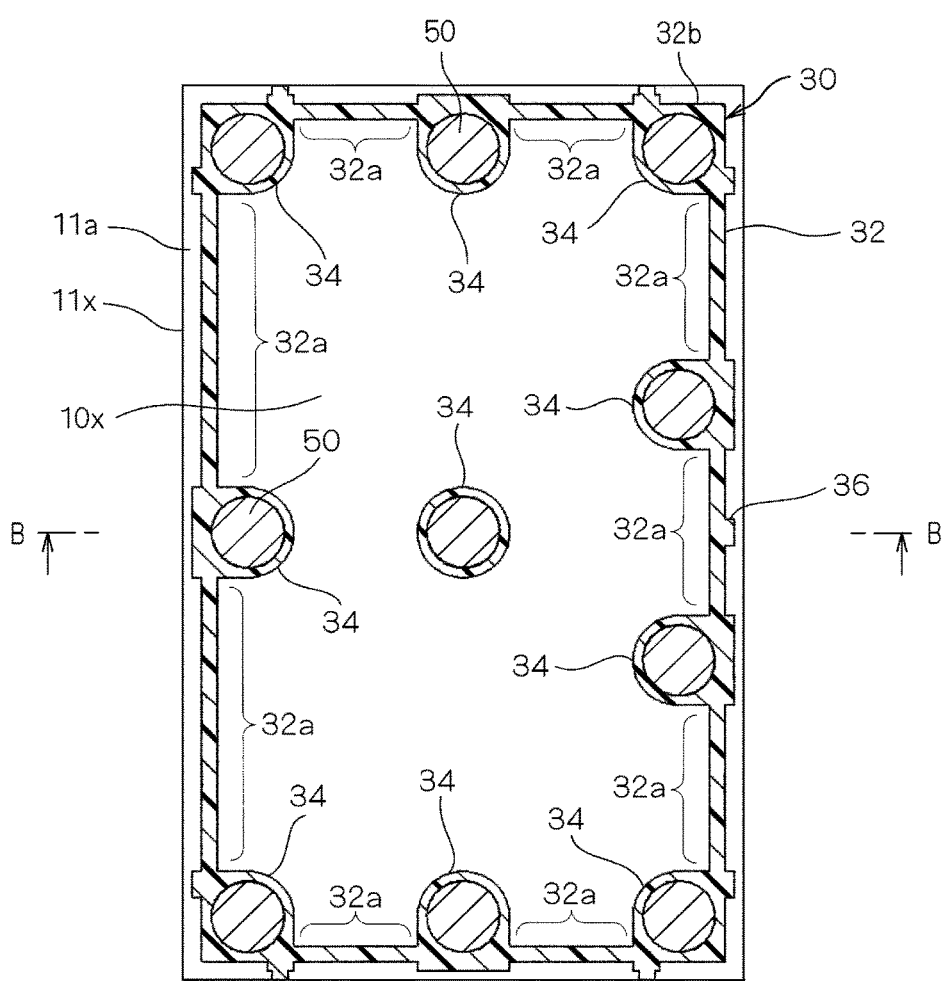
FIG. 2 is a sectional view of the surface acoustic wave device according to Preferred Embodiment 1 of the present invention.

FIG. 1 is a sectional view of the surface acoustic wave device 10. FIG. 2 is a sectional view taken along line A-A in FIG. 1. FIG. 1 is a sectional view taken along line B-B in FIG. 2. As illustrated in FIG. 1 and FIG. 2, in the surface acoustic wave device 10, in outline, a support layer 30 is located on a main surface 11a of a piezoelectric substrate 11 and a cover 40 is bonded to the support layer 30. More detailed description will be given later, but, on the main surface 11a of the piezoelectric substrate 11, a conductor pattern includes metal films 13a and 13b, through conductors 50, which penetrate through the support layer 30 and the cover 40, are provided, and solder bumps 54, which define and function as external terminals, are provided on the cover 40.

As illustrated in FIG. 2, the support layer 30 includes a frame 32 that has a frame-shaped structure so as to extend along an outer peripheral edge 11x of the main surface 11a of the piezoelectric substrate 11 and so that a gap is provided between the frame 32 and the outer peripheral edge 11x, pad adjacent portions 34 that each surround the circumference of a corresponding through conductor 50 and reinforcement portions 36. The frame 32 includes separated portions 32a that are separated from the pad adjacent portions 34 and integrated portions 32b that are integrated with the pad adjacent portions 34. A closed space 10x surrounded by the support layer 30 is provided between the piezoelectric substrate 11 and the cover 40.

Figures 3A, 3B:
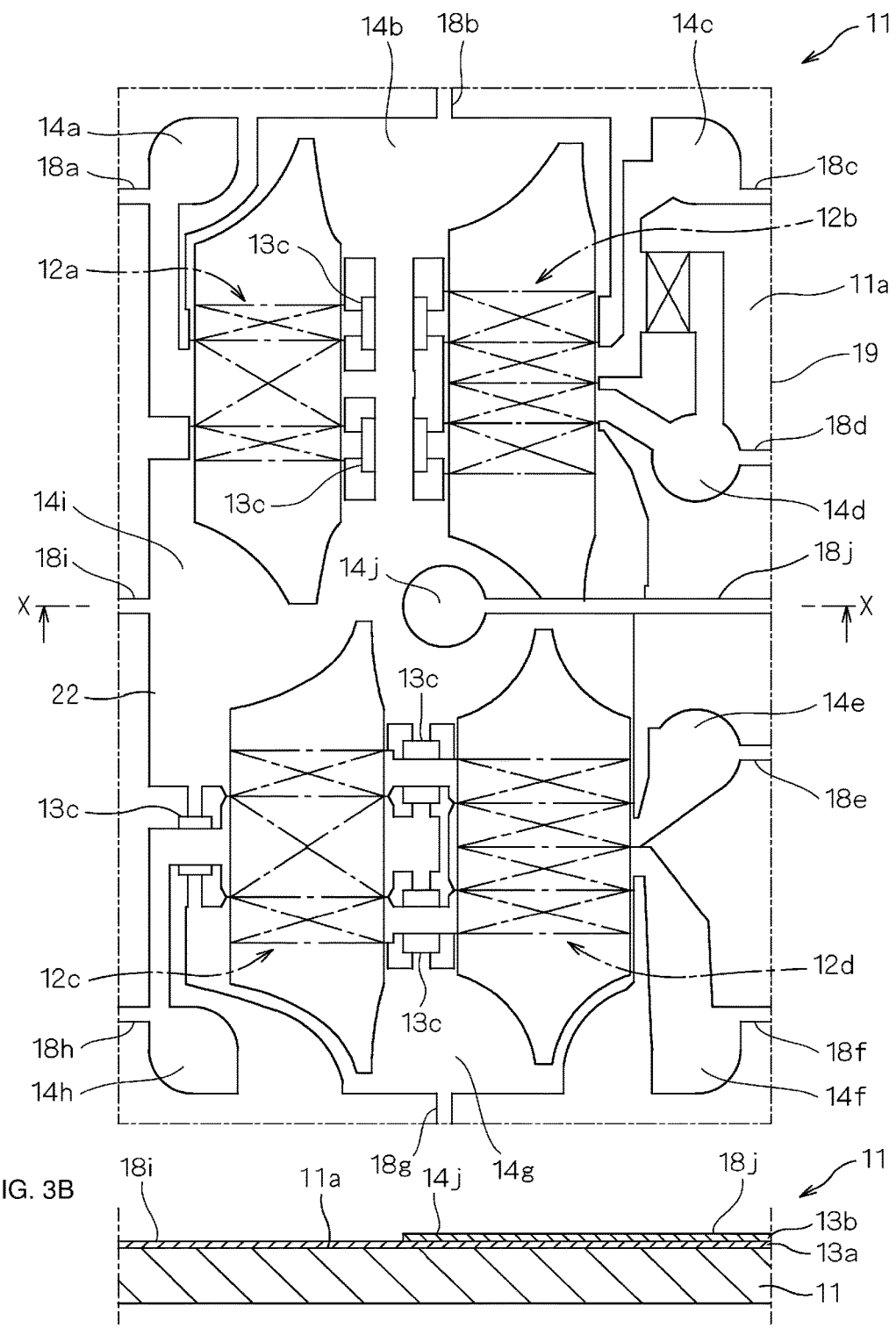
FIGS. 3A and 3B are plan views illustrating a manufacturing step for the surface acoustic wave device according to Preferred Embodiment 1 of the present invention.

The surface acoustic wave device 10 can be manufactured with the steps illustrated in FIGS. 3A to 8 using the wafer piezoelectric substrate 11. FIG. 3A and FIG. 4A are plan views of the piezoelectric substrate 11 and a boundary line of a region (individual substrate region) corresponding to one substrate is indicated by a chain line. FIG. 3B and FIG. 4B are sectional views taken along line X-X in FIGS. 3A and 4A. FIGS. 5 to 8 are sectional views similar to FIGS. 3B and 4B.

(a) Conductor Pattern Formation Step

As illustrated in FIGS. 3A and 3B, a conductor pattern including surface acoustic wave element patterns 12a to 12d, which include IDT electrodes and reflectors, pads 14a to 14j, feed lines 18a to 18j that are electrically connected to the pads 14a to 14j and wiring lines that are electrically connected between IDT electrodes of the surface acoustic wave element patterns 12a to 12d, between IDT electrodes of the surface acoustic wave element patterns 12a to 12d and the pads 14a to 14j and so forth is formed on the main surface 11a of the wafer piezoelectric substrate. The feed lines 18a to 18j intersect the boundary line 19 and are electrically connected between pads of adjacent individual substrate regions.

For example, the metal films 13a and 13b and insulating films 13c are formed on the main surface 11a of the piezoelectric substrate 11, which is a lithium tantalate (LiTaO$_3$) substrate or a lithium niobate (LiNbO$_3$) substrate, for example, and patterning is performed using a photolithography technique or an etching technique. In order to form wiring lines in three dimensions, the insulating films 13c are interposed between the metal films 13a and 13b.

(b) Support Layer Formation Step

Figures 4A, 4B:
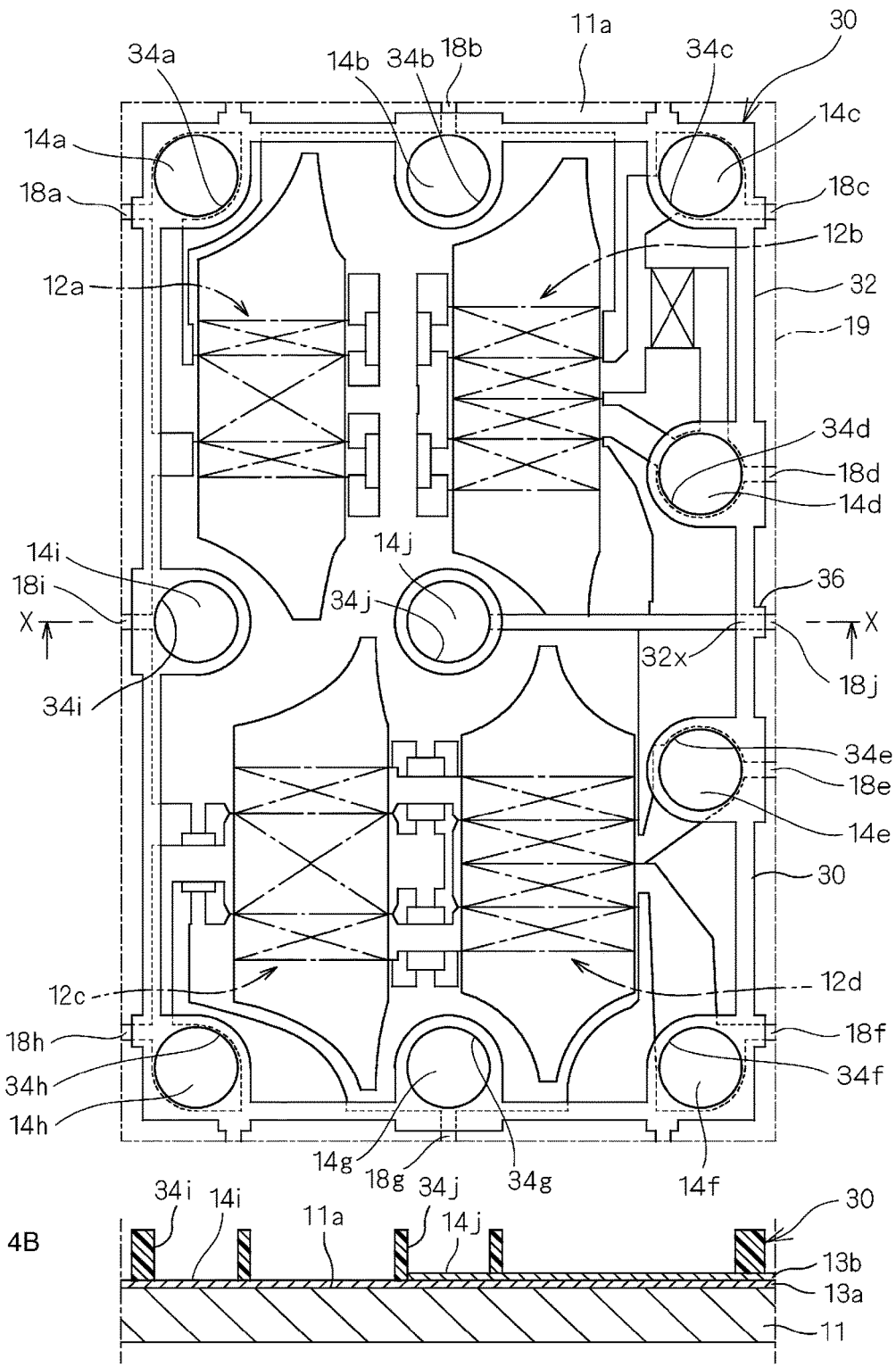
FIGS. 4A and 4B are plan views illustrating a manufacturing step for the surface acoustic wave device according to Preferred Embodiment 1 of the present invention.

Next, as illustrated in the plan view of FIGS. 4A and 4B, the support layer 30 is formed on the main surface 11a of the piezoelectric substrate. The support layer 30 includes the frame 32, which is formed so as to extend along the boundary line 19 and so that a gap is provided between itself and the boundary line 19, the pad adjacent portions 34, which are formed on the pads 14a to 14j and in which through holes 34a to 34j are formed through which the pads 14a to 14j are exposed, and the reinforcement portions 36, which will be described in more detail later.

The support layer 30 is formed in a certain shape by, for example, applying a photosensitive polyimide-based resin to the entirety of the main surface 11a of the piezoelectric substrate 11 and then removing unwanted portions by using a photolithography technique.

(b) Cover Formation Step

Figure 5:
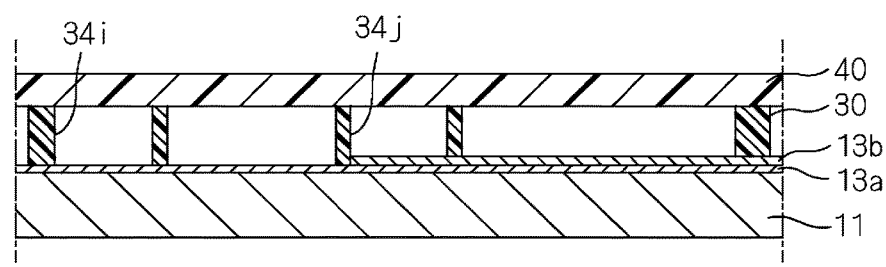
FIG. 5 is a sectional view illustrating a manufacturing step for the surface acoustic wave device according to Preferred Embodiment 1 of the present invention.

Next, as illustrated in the sectional view of FIG. 5, the cover 40 is bonded to the top of the support layer 30. For example, a resin sheet such as one including a non-photosensitive epoxy-based resin film that can be subjected to a low temperature curing process is adhered to the top of the support layer 30 by lamination.

(d) Through Hole Formation Step

Figure 6:
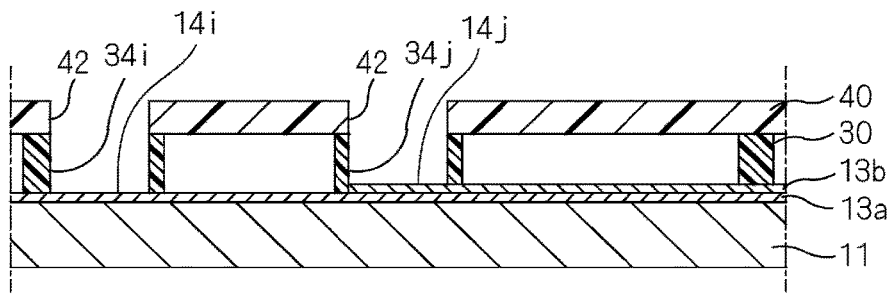
FIG. 6 is a sectional view illustrating a manufacturing step for the surface acoustic wave device according to Preferred Embodiment 1 of the present invention.

Next, as illustrated in the sectional view of FIG. 6, through holes 42, which are continuous with the through holes 34a to 34j in the support layer 30, are formed in the cover 40 by laser processing for example, thus causing the pads 14a to 14j to be exposed.

The cover 40 in which the through holes 42 have been formed may be bonded to the top of the support layer 30 in the cover formation step after forming the through holes 42 in the cover 40.

In addition, the through holes 34a to 34j in the support layer 30 need not necessarily be formed in the support layer formation step. In other words, the through holes 42 and the through holes 34a to 34j, which are continuous with each other, may be formed at the same time in the cover 40 and the support layer 30 by laser processing, for example, after bonding the cover 40 and the support layer 30 to each other.

(d) Through Conductor Formation Step

Figure 7:
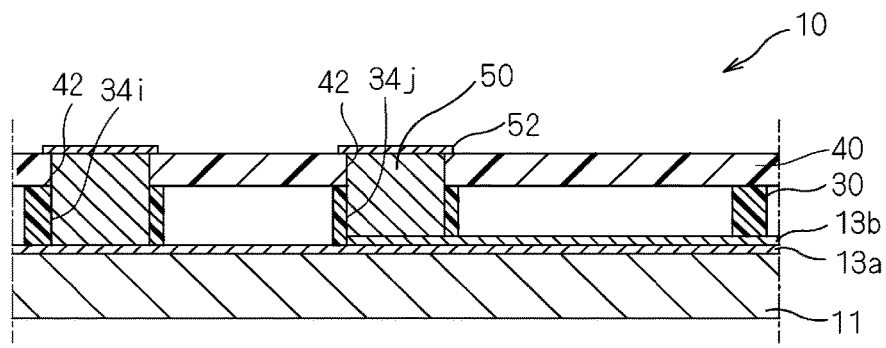
FIG. 7 is a sectional view illustrating a manufacturing step for the surface acoustic wave device according to Preferred Embodiment 1 of the present invention.

Next, as illustrated in the sectional view of FIG. 7, the through conductors 50 are formed by filling the through holes 42 and 34a to 34j with a metal (such as Cu or Ni) by performing electroplating and Au films with a thickness of about 0.05 μm to about 0.1 μm, for example, are formed on the surfaces of the through conductors 50 as underbump metal layers 52.

(e) External Terminal Formation Step

Figure 8:
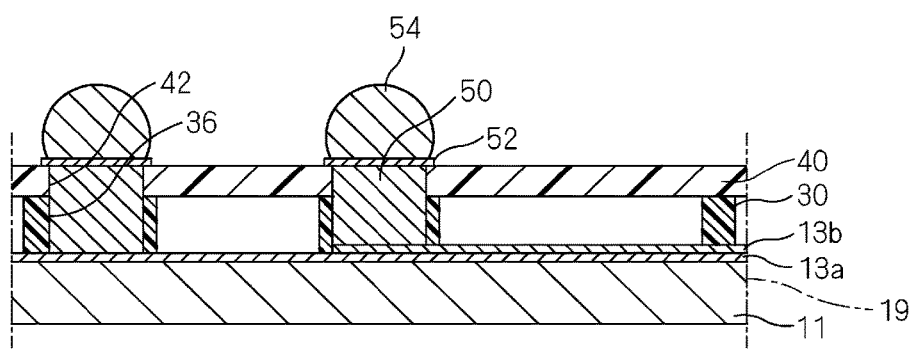
FIG. 8 is a sectional view illustrating a manufacturing step for the surface acoustic wave device according to Preferred Embodiment 1 of the present invention.

Next, as illustrated in the sectional view of FIG. 8, spherical solder bumps 54 are formed by printing a solder paste such as Sn—Ag—Cu on top of the underbump metal layers 52 via a metal mask, heating the solder paste at a temperature at which the solder paste melts such as about 260° C., for example, to make the solder adhere to the Au films, and removing flux by using a flux cleaning agent.

(e) Substrate Division Step

Next, dicing processing is performed in which the piezoelectric substrate 11 is cut using a dicing blade along the boundary line 19. The piezoelectric substrate 11 is divided into individual substrates through the dicing processing so as to complete the surface acoustic wave device 10 illustrated in FIG. 1.

In the surface acoustic wave device 10 manufactured through the above-described steps, the feed lines 18a to 18j are cut when the dicing processing is performed and therefore extend up to the outer peripheral edge 11x of the main surface 11a of the piezoelectric substrate 11.

Among the feed lines 18a to 18j illustrated in FIGS. 3A and 3B and FIGS. 4A and 4B, the feed line 18j, which is electrically connected to the pad 14j arranged in the center of the main surface 11a of the piezoelectric substrate 11, is a separated feed line that intersects a separated portion 32a of the frame 32 of the support layer 30 that is separated from the pad adjacent portions 34. Hereafter, the feed line 18j will also be referred to as a separated feed line 18j.

Figure 9:
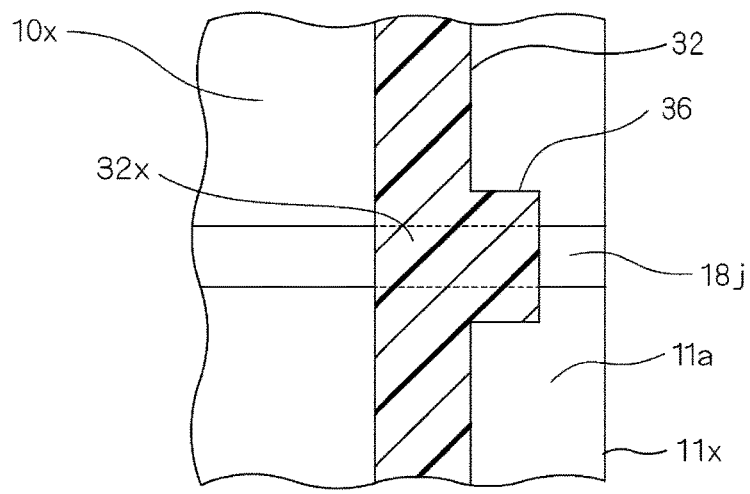
FIG. 9 is an enlarged sectional view of an important portion of the surface acoustic wave device according to Preferred Embodiment 1 of the present invention.

FIG. 9 is an enlarged sectional view of an important portion of FIG. 2. As illustrated in FIG. 2 and FIG. 9, the reinforcement portion 36 of the support layer 30 is adjacent to an intersection portion 32x of the frame 32 of the support layer 30, the separated portion 32a, which is separated from the pad adjacent portions 34, and the separated feed line 18j intersecting each other in the intersection portion 32x, and the reinforcement portion 36 is formed so as to be integrated with the frame 32 on the outer side of the frame 32.

Reduction of the sealing property of the closed space 10x is prevented by the reinforcement portions 36. In other words, the separated feed line 18j may peel off from the main surface 11a of the piezoelectric substrate 11 when the aggregate substrate is cut by dicing processing, and in such a case, stress may act on the separated portion 32a of the support layer 30 from the separated feed line 18j that has peeled off from the main surface 11a causing peeling off from the main surface 11a. As a result, the adhesion between the separated feed line 18j, the frame 32 of the support layer 30 and the main surface 11a of the piezoelectric substrate 11 is reduced and the airtight state of the closed space 10x may be reduced. Accordingly, when the reinforcement portions 36 are added, peeling off of the separated feed line 18j is able to be stopped in front of the frame 32 by the reinforcement portion 36 and reduction of the sealing property of the closed space 10x is suppressed or prevented.

The frame 32 of the support layer 30 is formed so that a gap is provided between itself and the boundary line 19 in order that clogging up of the dicing blade is avoided and the dicing processing is able to be efficiently performed. On the other hand, the reinforcement portions 36 of the support layer are only formed in portions of the support layer 30 and therefore it is not likely that clogging up of the dicing blade will occur. Consequently, the reinforcement portions 36 may be formed so as to reach the boundary line 19.

If the reinforcement portions of the support layer 30 have a shape that makes it possible for stress acting on the separated feed line 18j when the separated feed line 18j is cut by the dicing processing to be released, it is possible to suppress or prevent reduction of the sealing property of the closed space 10x and therefore, for example, the reinforcement portions 36 is able to have shapes such as those in FIGS. 10 to 13. FIGS. 10 to 13 are enlarged sectional views similar to FIG. 9.
Modification 1

Figure 10:
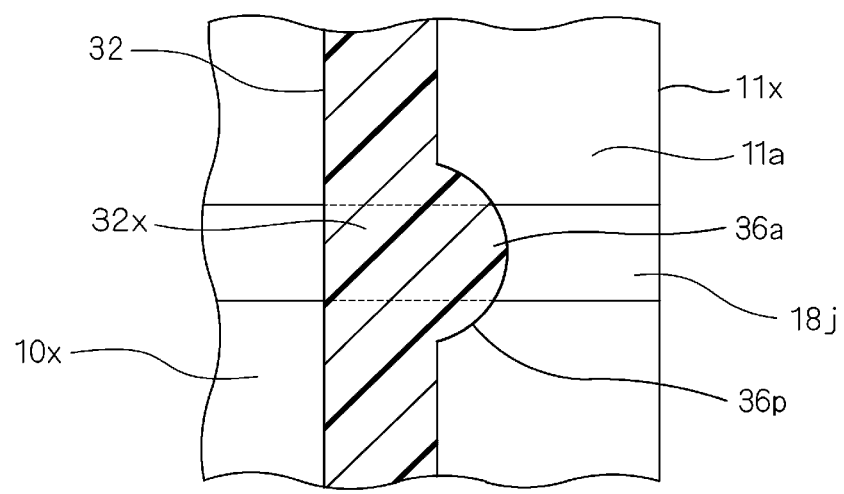
FIG. 10 is an enlarged sectional view of an important portion of the surface acoustic wave device according to Modification 1 of a preferred embodiment of the present invention.
Figure 11:
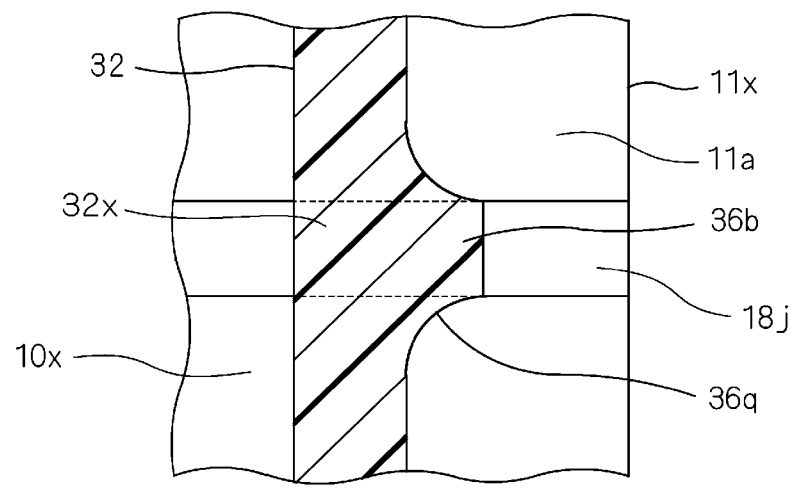
FIG. 11 is an enlarged sectional view of an important portion of the surface acoustic wave device according to Modification 1 of a preferred embodiment of the present invention.

As illustrated in FIGS. 10 and 11, reinforcement portions 36a and 36b of Modification 1 of a preferred embodiment of the present invention are preferably integrated with the frame 32 on the outer side of the frame 32 such that the width of the reinforcement portions 36a and 36b (dimension in vertical direction in FIG. 10 and FIG. 11), which is the dimension in a direction in which they intersect the separated feed line 18j, becomes progressively larger toward the frame 32. In this case, stress in a direction in which the separated feed line 18j extends (lateral direction in FIG. 10 and FIG. 11) acting at the time of the dicing processing is released in a direction different to the direction in which the separated feed line 18j extends by the reinforcement portions 36a and 36b. Cross sections 36p and 36q of the reinforcement portions 36a and 36b on the two sides of the separated feed line 18j have a convex shape or a concave shape, but may instead have a linear shape.
Modification 2

Figure 12:
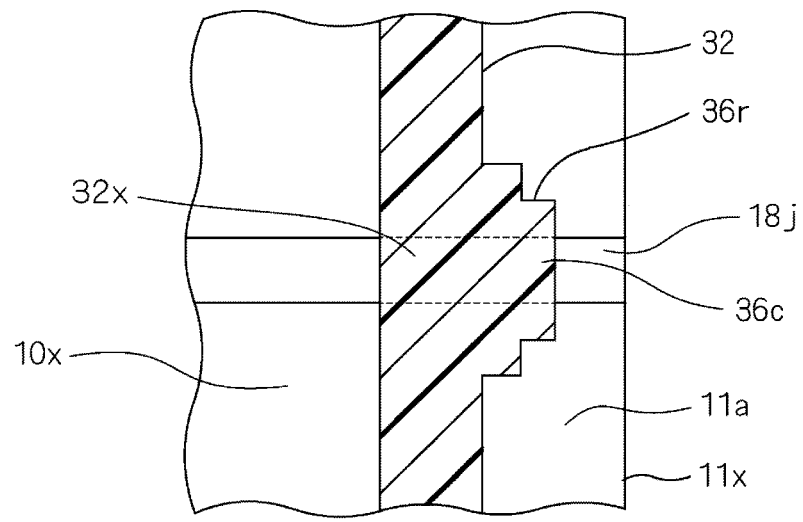
FIG. 12 is an enlarged sectional view of an important portion of the surface acoustic wave device according to Modification 2 of a preferred embodiment of the present invention.

As illustrated in FIG. 12, a reinforcement portion 36c of Modification 2 of a preferred embodiment of the present invention is preferably integrated with the frame 32 on the outer side of the frame 32 such that the width of the reinforcement portion 36c, which is a dimension in a direction in which the reinforcement portion 36c intersects the separated feed line 18j (dimension in vertical direction in FIG. 12), becomes larger in a stepwise manner toward the frame 32. In this case, stress in a direction in which the separated feed line 18j extends (lateral direction in FIG. 12) acting at the time of the dicing processing is released in a direction different to the direction in which the separated feed line 18j extends by the reinforcement portion 36c.
Modification 3

Figure 13:
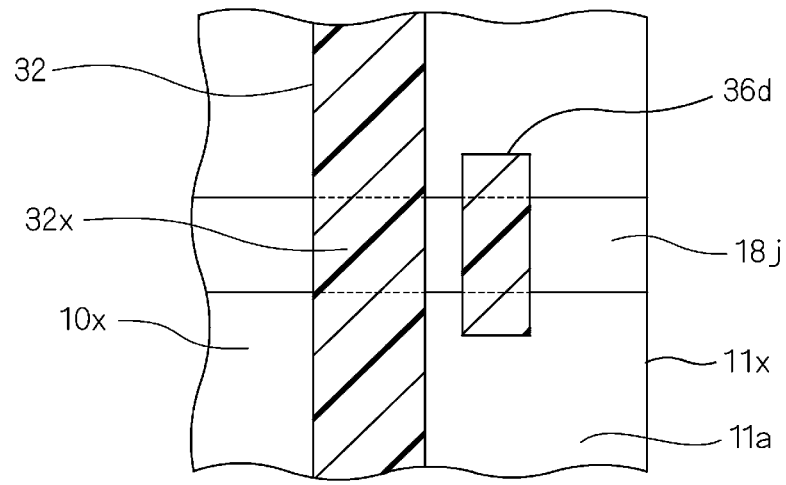
FIG. 13 is an enlarged sectional view of an important portion of the surface acoustic wave device according to Modification 3 of a preferred embodiment of the present invention.

As illustrated in FIG. 13, a reinforcement portion 36d of Modification 3 of a preferred embodiment of the present invention is preferably located outside the frame 32 so as to be separated from the frame 32. In this case, peeling off of the separated feed line 18j is able to be stopped in front of the frame 32 by the reinforcement portion 36d and reduction of the sealing property of the closed space 10x is suppressed or prevented. The reinforcement portion 36d illustrated in FIG. 13 which is separated from the frame 32 can be combined with Modification 1 or Modification 2. More specifically, the reinforcement portion 36d, which is separated from the frame 32, may be formed so as to become larger in a stepwise manner toward the frame 32.

As described above, when a reinforcement portion having a shape that allows stress acting in a direction in which a separated feed line peels off is formed and located on the separated feed line, peeling off of the feed line from a piezoelectric substrate during dicing processing is significantly reduced or prevented and reduction of the sealing property of a closed space can be suppressed or prevented.

Figure 14A:
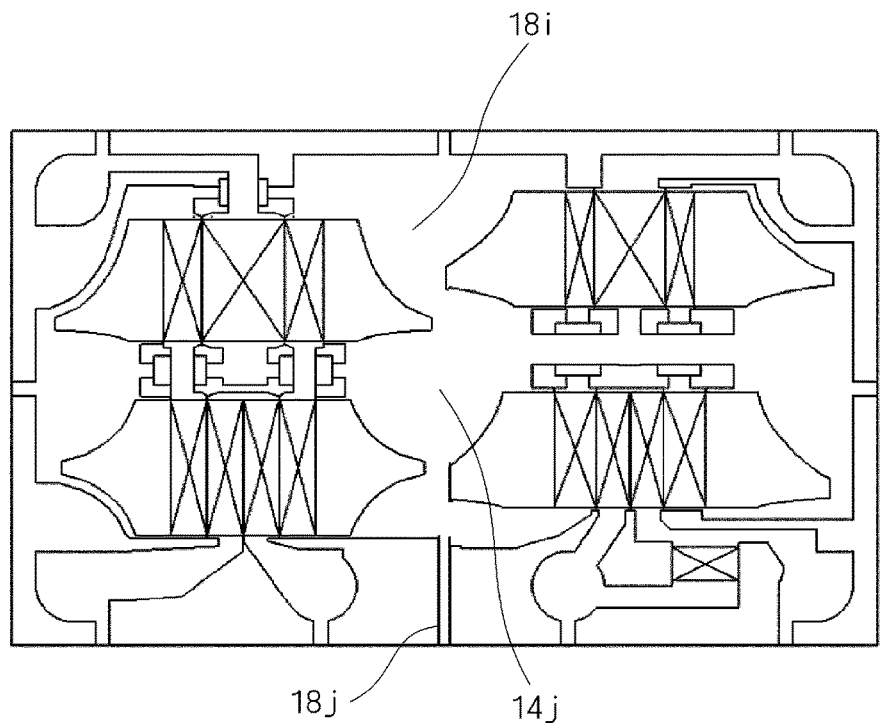
FIGS. 14A and 14B are plan views illustrating a modification of a manufacturing step for the surface acoustic wave device.
Figure 14B:
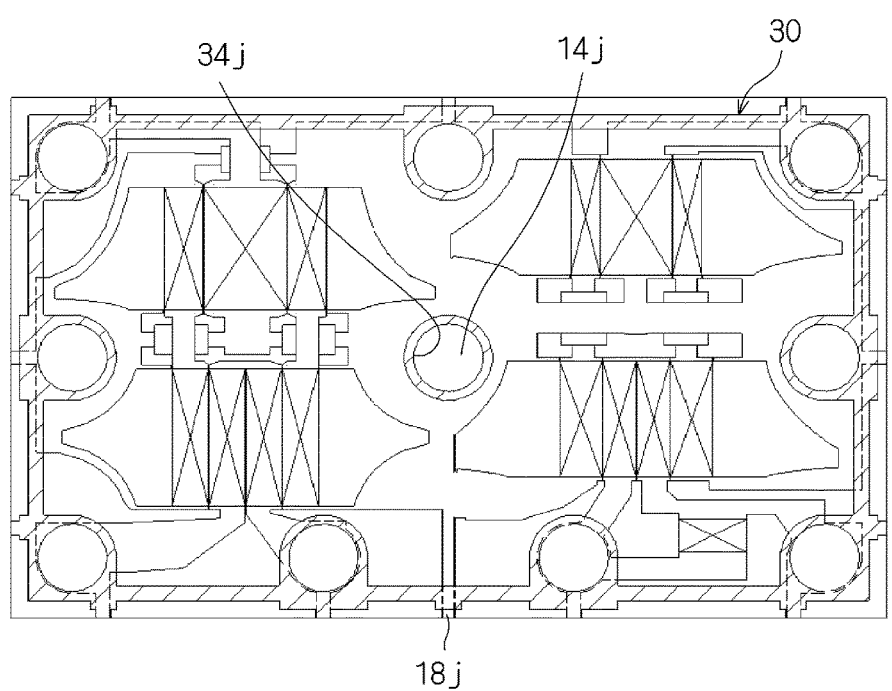
Figure 15:
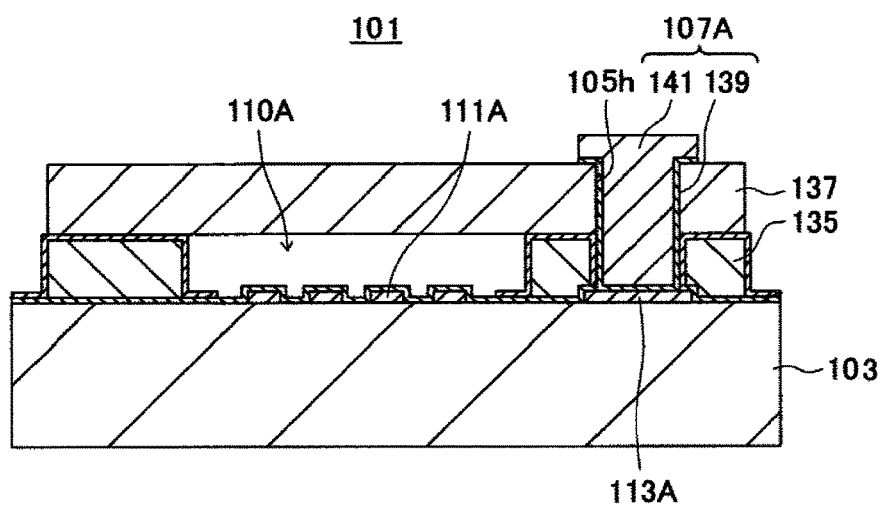
FIG. 15 is a sectional view of a surface acoustic wave device (related art example 1).

In addition, the present invention is not limited to the above-described preferred embodiments and modifications thereto, and can be modified in various ways. More specifically, it is not necessary to form the separated feed line 18j of two layers by stacking the separated feed line 18j on the feed line 18i as in the case of the separated feed line 18j illustrated in FIGS. 3A and 3B. That is, the separated feed line 18j may be formed by being extracted from a one layer feed line as illustrated in FIGS. 14A and 14B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A surface acoustic wave device comprising:
a piezoelectric substrate including a main surface;
a conductor pattern located on the main surface and including a surface acoustic wave element pattern, a pad and a feed line that is electrically connected to the pad and extends up to an outer peripheral edge of the main surface;

a support layer including a frame that is located on the main surface and has a frame-shaped structure that extends along the outer peripheral edge of the main surface and so that a gap is provided between the frame and the outer peripheral edge, and a pad adjacent portion that is located on the pad;

a cover that is bonded to the support layer and faces the main surface; and a through conductor that is electrically connected to the pad and is located inside a through hole that penetrates through the pad adjacent portion of the support layer in a direction in which the main surface is viewed in plan; wherein a closed space is provided and surrounded by the piezoelectric substrate, the cover and the support layer;

the feed line includes a separated feed line that intersects a separated portion of the frame that is separated from the pad adjacent portion; and the support layer further includes a reinforcement portion that is located on the main surface and intersects the separated feed line close to the separated portion.

2. The surface acoustic wave device according to claim 1, wherein the reinforcement portion is located on an outer side of the frame; and a width of the reinforcement portion, which is a dimension in a direction in which the reinforcement portion intersects the separated feed line, progressively becomes larger toward the frame.

3. The surface acoustic wave device according to claim 1, wherein the reinforcement portion is located on an outer side of the frame; and a width of the reinforcement portion, which is a dimension in a direction in which the reinforcement portion intersects the separated feed line, becomes larger in a stepwise manner toward the frame.

4. The surface acoustic wave device according to claim 1, wherein the reinforcement portion is located outside the frame and is separated from the frame.

5. The surface acoustic wave device according to claim 1, wherein the reinforcement portion is integrated with the frame on an outer side of the frame.

6. The surface acoustic wave device according to claim 1, wherein the reinforcement portion includes a plurality of reinforcement portions provided only in portions of the support layer.

7. The surface acoustic wave device according to claim 1, wherein the reinforcement portion includes a plurality of reinforcement portions integrated with the frame on an outer same of the frame.

8. The surface acoustic wave device according to claim 7, wherein a width of each of the reinforcement portions, which is a dimension in a direction in which the plurality of reinforcement portions intersect the separated feed line, progressively becomes larger toward the frame.

9. The surface acoustic wave device according to claim 7, wherein the reinforcement portion is integrated with the frame on an outer same of the frame, and a width of the reinforcement portion, which is a dimension in a direction in which the plurality of reinforcement portions intersect the separated feed line, progressively becomes larger in a stepwise manner toward the frame.

10. The surface acoustic wave device according to claim 7, wherein the separated feed line is one of a single layer feed line and a two layer feed line.

* * * * *